United States Patent
Abadeer et al.

(10) Patent No.: US 7,847,605 B2
(45) Date of Patent: *Dec. 7, 2010

(54) VOLTAGE DETECTION CIRCUIT IN AN INTEGRATED CIRCUIT AND METHOD OF GENERATING A TRIGGER FLAG SIGNAL

(75) Inventors: Wagdi W. Abadeer, Jericho, VT (US); Jeffrey S. Brown, Middlesex, VT (US); Albert M. Chu, Essex, VT (US); John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 23 days.

This patent is subject to a terminal disclaimer.

(21) Appl. No.: 12/242,114

(22) Filed: Sep. 30, 2008

(65) Prior Publication Data

US 2009/0021289 A1 Jan. 22, 2009

Related U.S. Application Data

(63) Continuation of application No. 11/623,119, filed on Jan. 15, 2007, now Pat. No. 7,466,171.

(51) Int. Cl.
*H03L 7/00* (2006.01)
(52) U.S. Cl. ........................ 327/143; 327/198
(58) Field of Classification Search ................. 327/143, 327/198
See application file for complete search history.

(56) References Cited

U.S. PATENT DOCUMENTS

| | | | |
|---|---|---|---|
| 3,571,626 A | 3/1971 | Reif | |
| 3,622,805 A | 11/1971 | McMorrow, Jr. | |
| 3,828,204 A | 8/1974 | Farnsworth | |
| 3,879,669 A | 4/1975 | Moriyasu | |
| 4,063,119 A | 12/1977 | Odell et al. | |
| 4,142,118 A | * 2/1979 | Guritz | 327/72 |
| 4,694,198 A | 9/1987 | Umeki | |
| 5,116,342 A | 5/1992 | Schmidt et al. | |
| 5,144,159 A | 9/1992 | Frisch et al. | |
| 5,214,316 A | * 5/1993 | Nagai | 327/143 |
| 5,336,942 A | 8/1994 | Khayat | |

(Continued)

OTHER PUBLICATIONS

Notice of Allowance dated Apr. 3, 2009, in connection with related U.S. Appl. No. 11/623,112.

(Continued)

*Primary Examiner*—Kenneth B. Wells
(74) *Attorney, Agent, or Firm*—Downs Rachlin Martin PLLC

(57) ABSTRACT

An integrated circuit that includes at least one tunneling device voltage detection circuit for generating a trigger flag signal. The tunneling device voltage detection circuit includes first and second voltage dividers receiving a supply voltage and having corresponding respective first and second internal node output voltages. The first and second voltage dividers are configured so the first output voltage is linear relative to the supply voltage and so that the second output voltage is nonlinear relative to the supply voltage. As the supply voltage ramps up, the profiles of the first and second output voltage cross at a particular voltage. An operational amplifier circuit senses when the first and second output voltages become equal and, in response thereto, outputs a trigger signal that indicates that the supply voltage has reached a certain level.

18 Claims, 5 Drawing Sheets

U.S. PATENT DOCUMENTS

| | | | |
|---|---|---|---|
| 5,365,121 | A | 11/1994 | Morton et al. |
| 5,703,807 | A * | 12/1997 | Smayling et al. ........ 365/185.03 |
| 6,002,292 | A | 12/1999 | Allen et al. |
| 6,172,555 | B1 | 1/2001 | Gusinov |
| 6,285,222 | B1 | 9/2001 | Kitade |
| 6,335,649 | B1 | 1/2002 | Maeda |
| 6,549,040 | B1 | 4/2003 | Alvandpour et al. |
| 6,577,480 | B1 | 6/2003 | Avery et al. |
| 6,650,155 | B1 * | 11/2003 | Nguyen et al. ............... 327/143 |
| 6,756,839 | B2 | 6/2004 | Hall et al. |
| 6,801,060 | B2 | 10/2004 | Ikehashi et al. |
| 7,030,668 | B1 * | 4/2006 | Edwards ..................... 327/143 |
| 7,049,865 | B2 | 5/2006 | Parker et al. |
| 7,061,308 | B2 | 6/2006 | Abadeer et al. |
| 7,187,219 | B2 | 3/2007 | Olsen |
| 7,207,017 | B1 | 4/2007 | Tabery et al. |
| 7,466,171 | B2 * | 12/2008 | Abadeer et al. ............. 327/143 |
| 7,498,869 | B2 * | 3/2009 | Abadeer et al. ............. 327/541 |
| 2003/0030474 | A1 | 2/2003 | McGowan |
| 2003/0122595 | A1 | 7/2003 | Hall et al. |
| 2004/0041590 | A1 | 3/2004 | Bernstein et al. |
| 2004/0104744 | A1 | 6/2004 | Bosshart |
| 2004/0222827 | A1 * | 11/2004 | Degoirat et al. ............. 327/143 |
| 2004/0263208 | A1 | 12/2004 | Levy et al. |
| 2004/0263209 | A1 | 12/2004 | Choe |
| 2005/0073354 | A1 | 4/2005 | Abadeer et al. |
| 2006/0170487 | A1 | 8/2006 | Abadeer |
| 2006/0214695 | A1 | 9/2006 | Lih et al. |
| 2006/0290385 | A1 | 12/2006 | Belluomini et al. |
| 2008/0169837 | A1 | 7/2008 | Abadeer |
| 2008/0169839 | A1 | 7/2008 | Abadeer et al. |
| 2008/0169844 | A1 | 7/2008 | Abadeer |
| 2008/0169869 | A1 | 7/2008 | Abadeer |
| 2008/0229269 | A1 | 9/2008 | Lamorey |
| 2009/0021289 | A1 | 1/2009 | Abadeer et al. |

OTHER PUBLICATIONS

First Office Action dated Apr. 9, 2010 in connection with related U.S. Appl. No. 11/948,308 filed Nov. 30, 2007, entitled "Structure for a Voltage Detection Circuit in an Integrated Circuit and Method of Generating a Trigger Flag Signal," Wagdi W. Abadeer, Inventor.
First Office Action dated Apr. 21, 2008 in connection with related U.S. Appl. No. 11/623,119.
Response to First Office Action dated May 30, 2008 in connection with related U.S. Appl. No. 11/623,119.
Notice of Allowance dated Jul. 31, 2008 in connection with related U.S. Appl. No. 11/623,119.
U.S. Appl. No. 11/948,308 filed Nov. 30, 2007 entitled "Design Structure for a Voltage Detection Circuit in an Integrated Circuit and Method of Generating a Trigger Flag Signal," Wagdi Abadeer et al.
K.E. Kuijk, "A Precision Reference Voltage Source," IEEE Journal of Solid-State Circuits, vol. SC-8, pp. 222-226, Jun. 1973.
H. Banba, H. Shiga, A. Umezawa, T. Miyaba, T. Tanzawa, S. Atsumi, K. Sakui, "A CMOS Bandgap Reference Circuit with Sub-1-V Operation," IEEE Journal of Solid-State Circuits, vol. 34, No. 5, May 1999, pp. 670-674.
First Office Action dated Apr. 30, 2008 in connection with related U.S. Appl. No. 11/623,114.
Response to First Office Action dated Jun. 12, 2008 in connection with related U.S. Appl. No. 11/623,114.
Notice of Allowance dated Oct. 16, 2008 in connection with related U.S. Appl. No. 11/623,114.
C.H. Kim, K. Roy, S. Hsu, A. Alvandpour, R.K. Krishnamurthy, S. Borkar, "A Process Variation Compensating Technique For Sub-90 nm Dynamic Circuits," VLSI Circuits, 2003. Digest of Technical Papers, 2003 Symposium on Jun. 12-14, 2003, pp. 205-206.
V. Kursun, E.G. Friedman, "Domino Logic With Dynamic Body Biased Keeper," Solid-State Circuits Conference 2002, ESSCIRC 2002. Proceedings of the 28th European, Sep. 24-26, 2002, pp. 675-678.
Office Action dated May 16, 2008 with regard to related U.S. Appl. No. 11/851,133.
Amendment under 37 C.F.R. 1.111 with regard to related U.S. Appl. No. 11/851,133, dated Jun. 13, 2008.
Notice of Allowance dated Jul. 31, 2008 with regard to related U.S. Appl. No. 11/851,133.
First Office Action dated Jan. 23, 2008 with regard to related U.S. Appl. No. 11/623,112.
Response to First Office Action dated Apr. 14, 2008 with regard to related U.S. Appl. No. 11/623,112.
Second Office Action dated Jul. 31, 2008 with regard to related U.S. Appl. No. 11/623,112.
Response to First Office Action dated Jul. 9, 2010 in connection with related U.S. Appl. No. 11/948,308 filed Nov. 30, 2007, entitled "Structure for a Voltage Detection Circuit in an Integrated Circuit and Method of Generating a Trigger Flag Signal," Wagdi W. Abadeer.

* cited by examiner

VOLTAGE DETECTION CIRCUIT IN AN INTEGRATED CIRCUIT AND METHOD OF GENERATING A TRIGGER FLAG SIGNAL

RELATED APPLICATION DATA

This application is a continuation of U.S. patent application Ser. No. 11/623,119, filed Jan. 15, 2007, and titled "Voltage Detection Circuit in an Integrated Circuit and Method of Generating a Trigger Flag Signal," now U.S. Pat. No. 7,466,171, that is incorporated by referenced herein in its entirety.

FIELD OF THE DISCLOSURE

The present disclosure generally relates to the field of voltage detection circuits in integrated circuits. In particular, the present disclosure is directed to a voltage detection circuit in an integrated circuit and method of generating a trigger flag signal.

BACKGROUND

In an integrated circuit, analog, digital, or mixed-signal circuits have a range of power supply voltage within which they operate predictably and reliably. Consequently, integrated circuits typically include a power supply voltage detection circuit for monitoring the power supply during its power up sequence. More specifically, during the power up sequence of an integrated circuit, the power supply voltage may take hundreds of milliseconds to reach its desired value. Additionally, the power supply voltage may ramp up in a non-monotonic fashion, i.e., the power supply voltage may wobble up and down slightly as it is ramping up, until it reaches a stable desired voltage level. This is because during the power up sequence various circuits activate in sequence and may cause the demands on the power supply to vary in a nonlinear fashion. Consequently, the voltage detection circuit is utilized to detect when the power supply voltage has reached a certain minimum value and to generate an electronic indicator (e.g., a trigger flag) to the one or more circuits of interest, which is an indicator that a safe minimum operating voltage is reached.

Traditional power supply voltage detection circuits often trigger off of multiples of the voltage threshold (Vt) of a device, such as the Vt of a field-effect transistor (FET) device. In this scenario, when the power supply voltage reaches a value of, for example, Vt×1 or Vt×2, a trigger flag is generated. However, the Vt of devices changes with process, voltage, and temperature variations and, thus, using a multiple of Vt is not a stable way to establish a voltage detection circuit. More specifically, because the Vt value may vary +/−300-450 mV with process, voltage, and temperature, the trigger voltage that results from of a stack of transistors, which is used to generate multiples of Vt, may vary over several hundred millivolts (mV).

For at least these reasons, a need exists for a voltage detection circuit in an integrated circuit and method of generating a trigger flag signal, in order to provide a voltage detection circuit that has a more predictable and stable trigger flag signal as compared with traditional Vt-based voltage detection circuits.

SUMMARY OF THE DISCLOSURE

In one implementation, the present disclosure is directed to an integrated circuit chip. The integrated circuit chip includes: a power supply network for supplying a supply voltage to functional circuitry; and a trigger circuit that includes: a first voltage divider stack comprising: a first input in electrical communication with the power supply network; and a first internal node for providing a first divided output voltage; wherein the first voltage divider stack is configured so that the first divided output voltage has a linear relationship to the supply voltage; a second voltage divider stack electrically coupled to the power supply network in parallel with the first voltage divider stack, the second voltage divider stack comprising: a second input in electrical communication with the power supply network; and a second internal node for providing a second divided output voltage; wherein the second voltage divider stack is configured so that the second divided output voltage has a linear relationship to the supply voltage; and output circuitry in electrical communication with the first internal node and the second internal node and operatively configured to generate a digital trigger flag as a function of the first divided output voltage and the second divided output voltage.

In another implementation, the present disclosure is directed to an integrated circuit. The integrated circuit includes: a power supply network for supplying a supply voltage to functional circuitry; and a trigger circuit that includes: a first voltage divider stack comprising: a first input in electrical communication with the power supply network; and a first internal node for providing a first divided output voltage; wherein the first voltage divider stack is configured so that the first divided output voltage has a linear relationship to the supply voltage; a second voltage divider stack electrically coupled to the power supply network in parallel with the first voltage divider stack and comprising: a first current-tunneling device that includes a second input in electrical communication with the power supply network; and a second current-tunneling device electrically connected in series with the first current-tunneling device so as to define a second internal node for providing a second divided output voltage; wherein the second divided output voltage is generated as a function of substantially only tunneling current through the first and second current-tunneling devices; and output circuitry in electrical communication with the first internal node and the second internal node and operatively configured to generate a digital trigger flag as a function of the first divided output voltage and the second divided output voltage.

In still another implementation, the present disclosure is directed to an integrated circuit. The integrated circuit includes: a power network for providing a supply voltage; and a voltage detection circuit for providing a digital trigger flag, the voltage detection circuit comprising: a first tunneling-device stack having a first intermediate output node and configured so as to output a first output voltage that is a linear function of the supply voltage; a second tunneling-device stack having a second intermediate output node and configured so as to output a second output voltage that is a non-linear function of the supply voltage; and an operational amplifier circuit operatively configured to generate the digital trigger flag by comparing the first and second output voltages with one another; wherein, during operation, the voltage detection circuit generates the digital trigger flag in response to substantially only tunneling current through each of the first and second tunneling-device stacks.

BRIEF DESCRIPTION OF THE DRAWINGS

For the purpose of illustrating the invention, the drawings show aspects of one or more embodiments of the invention. However, it should be understood that the present invention is

Figure 1:
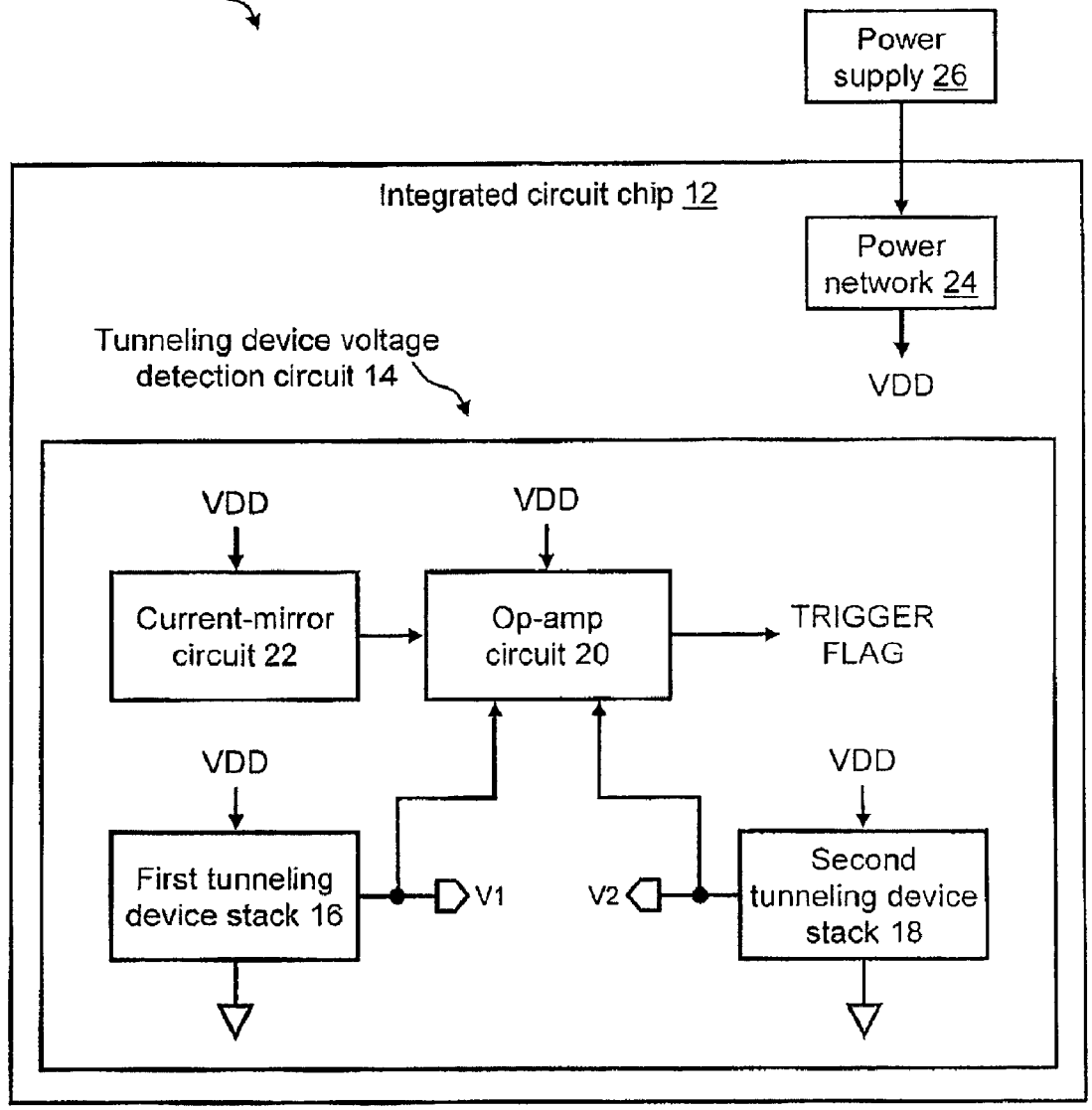
Figure 2:
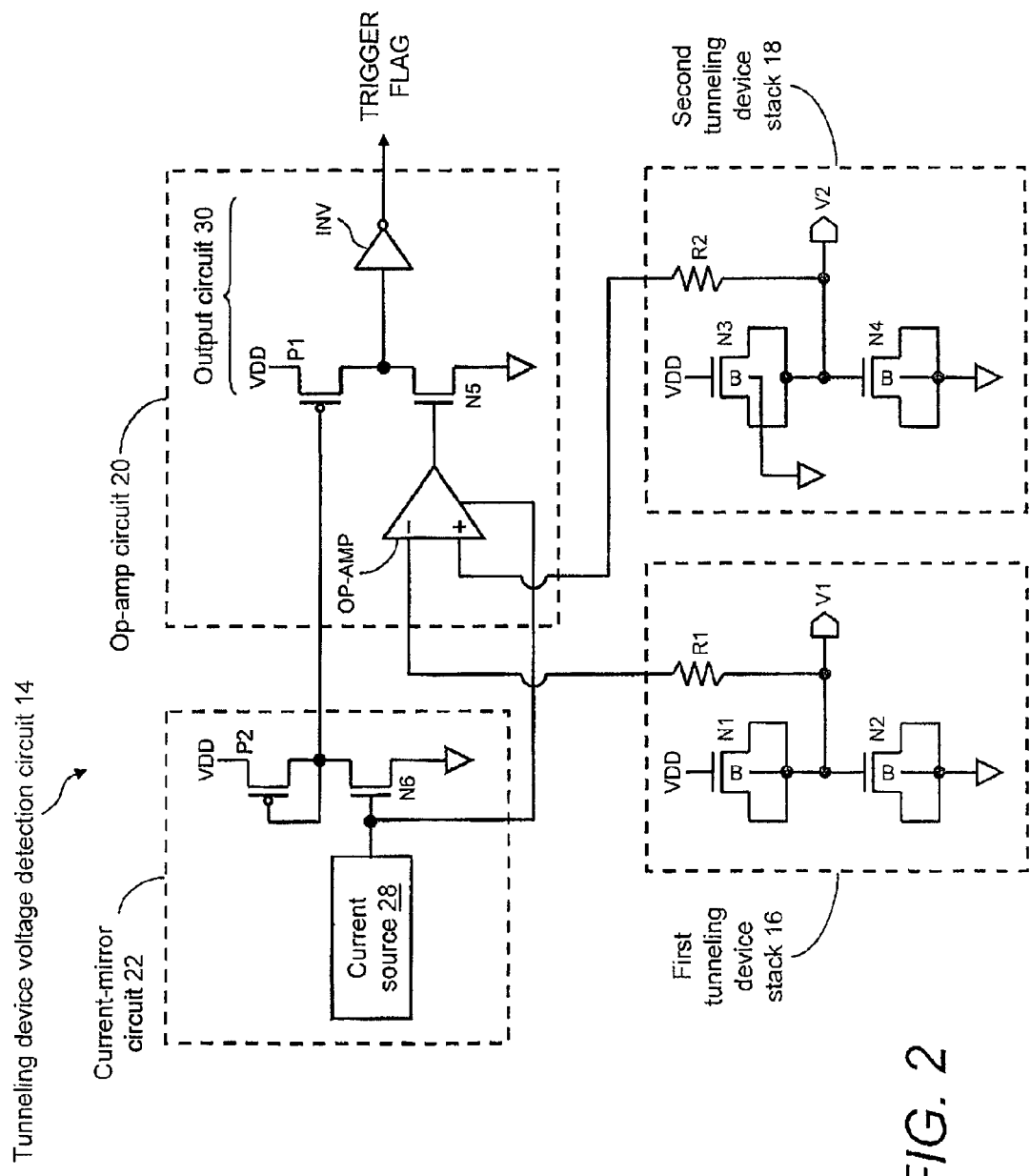
Figure 3:
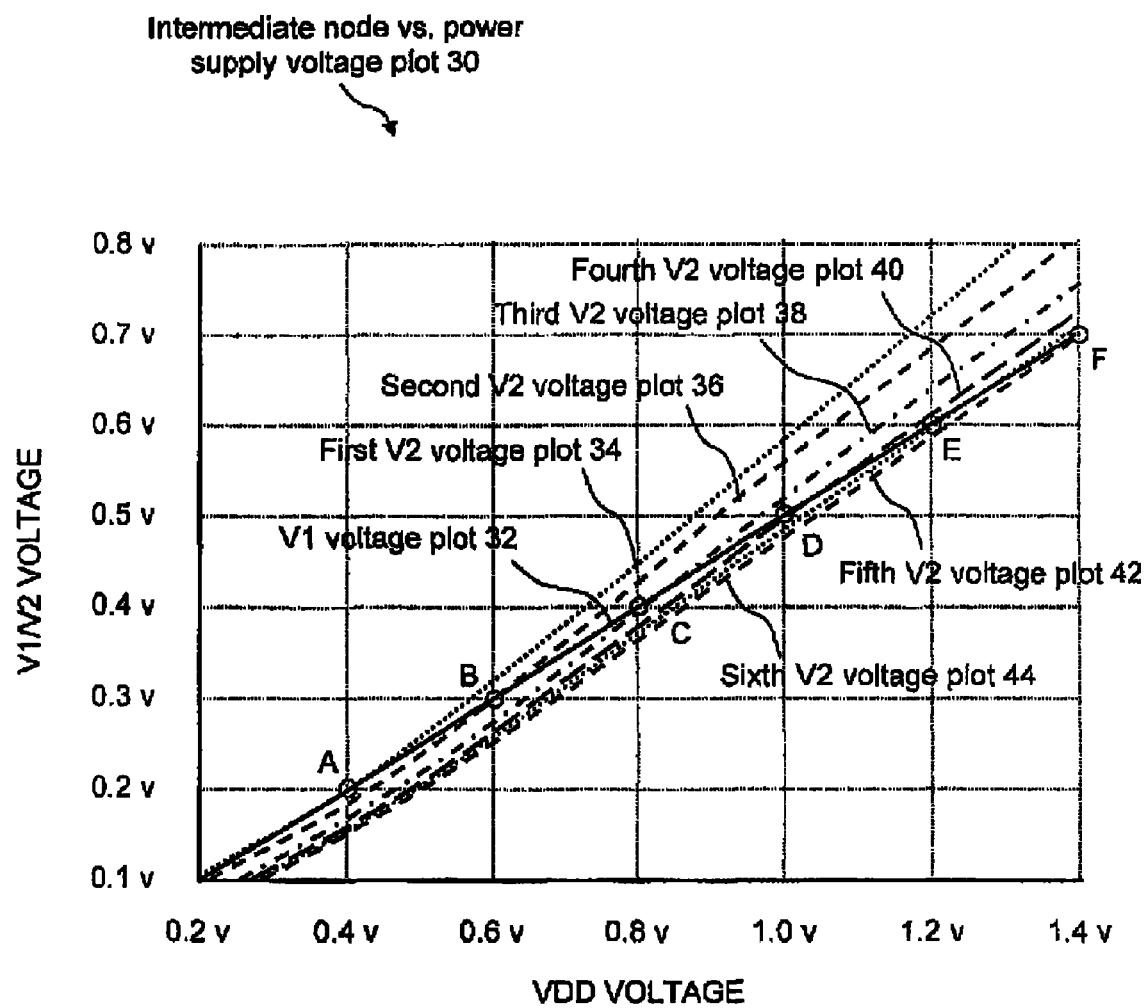
Figure 4:
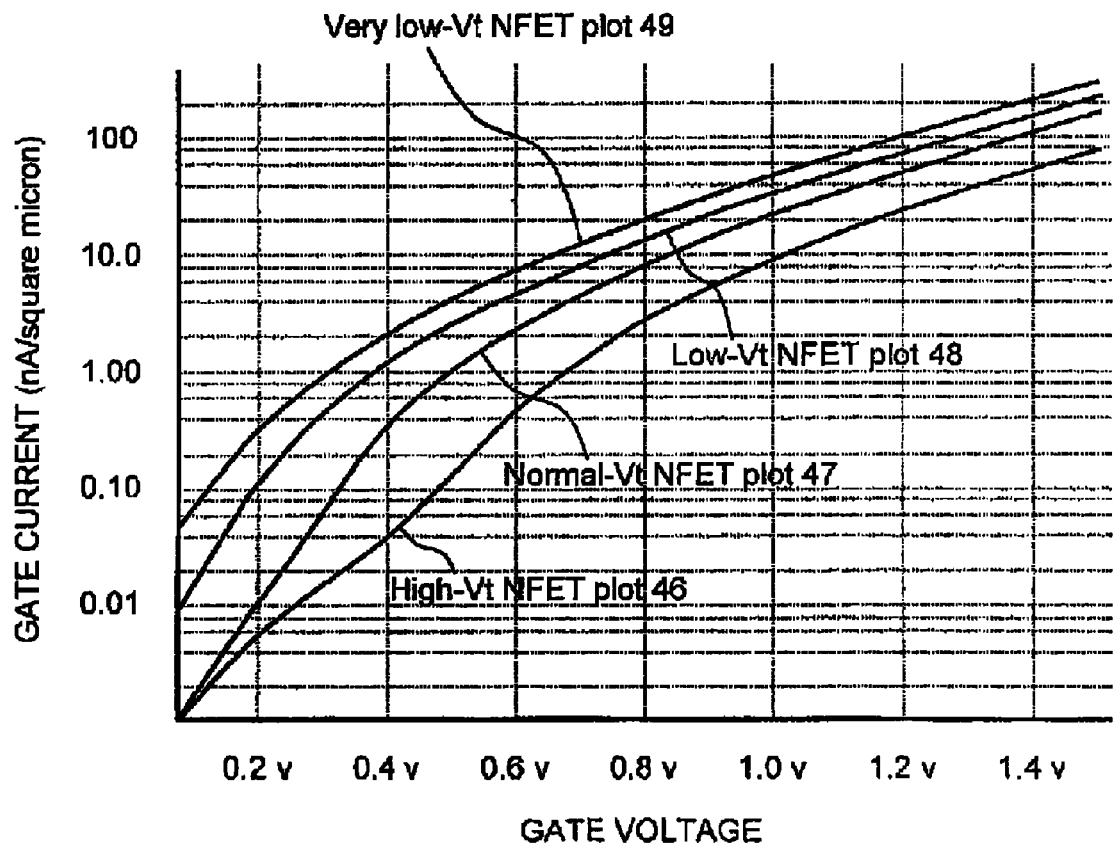
Figure 5:
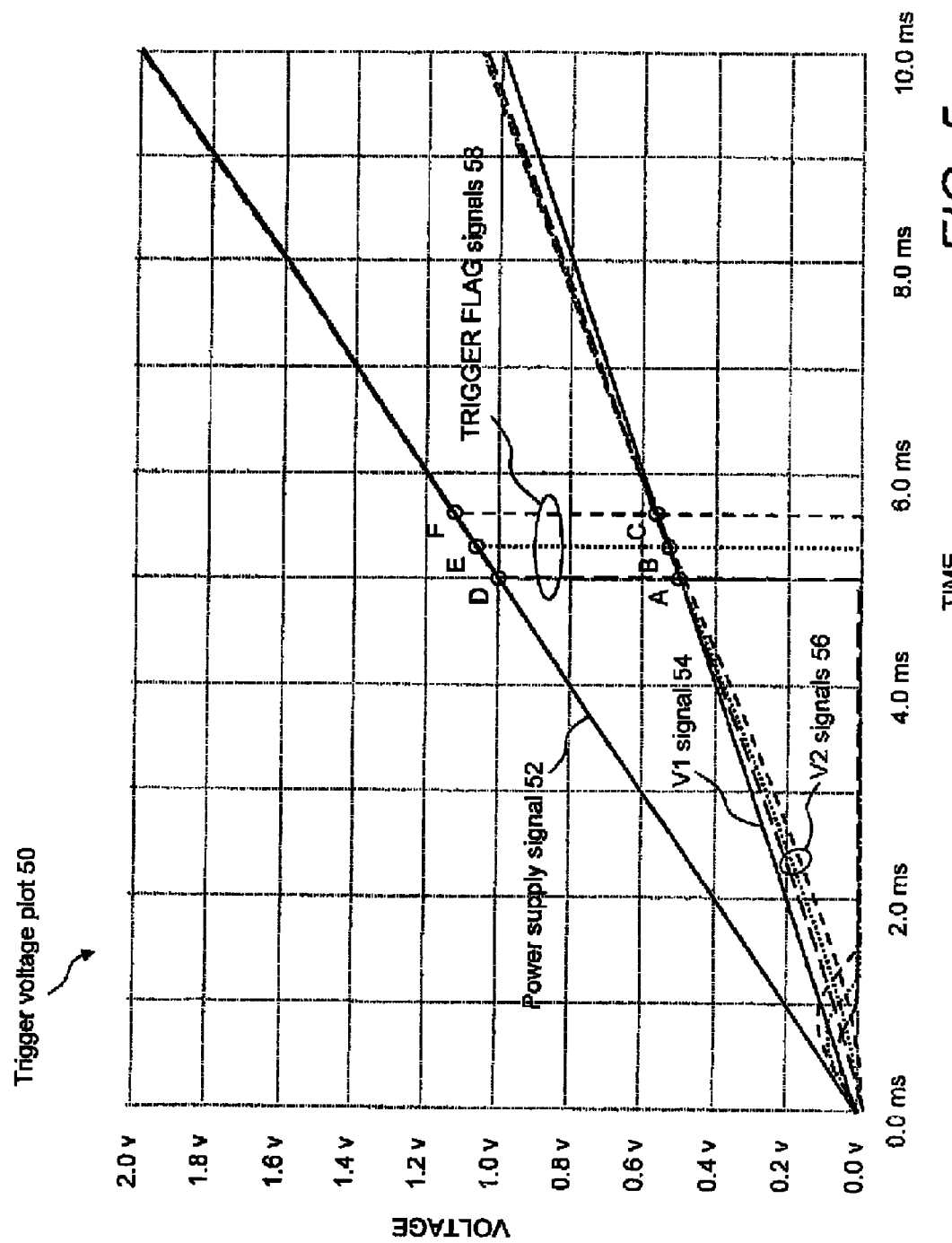

3 not limited to the precise arrangements and instrumentalities shown in the drawings, wherein:

FIG. 1 illustrates a functional block diagram of an integrated circuit that includes a tunneling device voltage detection circuit for generating a predictable and stable trigger flag signal;

FIG. 2 illustrates a schematic diagram of the tunneling device voltage detection circuit of FIG. 1;

FIG. 3 illustrates an exemplary intermediate node vs. power supply voltage plot for various device ratios within a second of two tunneling device stacks of the tunneling device voltage detection circuit of FIG. 2;

FIG. 4 is a graph showing the relative tunneling current of high-Vt, normal-Vt, low-Vt and very low-Vt devices as a function of gate voltage; and FIG. 5 illustrates an exemplary trigger voltage plot of the tunneling device voltage detection circuit of FIGS. 1 and 2.

DETAILED DESCRIPTION

Referring now to the drawings, FIG. 1 illustrates an integrated circuit 10 of the present invention that may be fabricated upon an integrated circuit chip 12 and that includes at least one tunneling device (TD) voltage detection circuit 14 made in accordance with the present disclosure. As described below in more detail, TD voltage detection circuit 14 generally includes a first device stack 16 that includes a first output voltage node V1 having a first voltage that varies linearly with a power supply voltage (here, voltage VDD) and a second device stack 18 that includes a second output voltage node V2 having a second voltage (also designated "V2" for convenience) that varies non-linearly with voltage VDD. (For convenience, certain voltage nodes and the voltages on those nodes are designated by the same descriptors, e.g., voltage node V1 has first voltage V1, voltage node V2 has second voltage V2, etc.) TD voltage detection circuit 14 may be electrically connected to one or more logic circuits, analog circuits, and/or mixed-signal circuits (not shown) within integrated circuit 10 as needed in a particular design. Those skilled in the art will readily appreciate the variety of circuits that may be used with TD voltage detection circuit 14. TD voltage detection circuit 14 may also include a differential operational amplifier (op-amp) circuit 20 and a current-mirror circuit 22, and integrated circuit 10 may further include a power network 24, which may be the power distribution network for supplying an operating voltage (e.g., voltage VDD or any multiple thereof) to, among other circuits, tunneling device voltage detection circuit 14. Integrated circuit 10 may be powered by, for example, a power supply 26 that feeds the input of power network 24 within integrated circuit chip 12. Power supply 26 may be, for example, an external direct current (DC) power supply. Example non-zero steady-state supply voltage VDD values may include, but are not limited to, 1.0, 1.2, and 3.3 volts.

As described below in more detail, TD voltage detection circuit 14 generally operates as follows. When power supply 26 is first started, supply voltage VDD is initially zero volts and then increases to a predetermined non-zero steady-state value. First and second device stacks 16, 18, which output a linear first voltage V1 and a non-linear second voltage V2, respectively, are designed so that at a first particular non-zero value of supply voltage VDD, the rising voltage profiles of first and second voltages cross one another at a second particular non-zero value. When op-amp circuit 20 detects this second particular non-zero value (by detecting when first and second voltages V1, V2 become equal, the op-amp circuit may output a trigger flag TRIGGER FLAG to the appropriate

4 circuitry (not shown) that indicates that VDD has reached a suitable level to sustain operability of integrated circuit 10. A designer may select the first and second particular non-zero values of supply voltage VDD and first and second voltages V1, V2, respectively, needed for a particular application, and design the components of TD voltage detection circuit 14 accordingly.

FIG. 2 illustrates a particular embodiment of TD voltage detection circuit 14 of FIG. 1 for generating a predictable and stable trigger flag signal TRIGGER FLAG. In this embodiment, first device stack 16 may include a stack of two similar transistors biased in a current tunneling mode in order to form a first voltage divider circuit. In one example, first device stack 16 includes n-type transistors N1, N2 electrically connected in series between VDD and ground so as to be biased in a current tunneling mode. In this example, first voltage V1 on intermediate voltage node V1 is substantially equal to one-half of supply voltage VDD. The bulk node B of transistor N1 is electrically connected to first voltage node V1, and the bulk node B of transistor N2 is electrically connected to ground. In alternative embodiments, first device stack 16 may be formed of a resistor divider network. In addition, it is noted that first voltage V1 is not limited to a one-half of supply voltage VDD; rather, the devices that form the first device stack may be sized such that first voltage V1 equals any division of supply voltage VDD.

In this example, transistors N1, N2 have substantially equal oxide thickness, substantially equal voltage thresholds (Vt), and substantially equal oxide areas. The range of oxide thickness is such that a tunneling current can flow through each of transistors N1, N2. This range may be about 4.0 nm down to about 0.8 nm. In one example, the oxide thickness of each transistor N1, N2 is 1.40 nm. The range of Vt may be about 100 mV to about 400 mV, which may be considered a typical or normal-Vt range for such devices. In one example, the normal-Vt of each transistor N1, N2 may be 0.347 V. The oxide area may be expressed in terms of channel width (W) and length (L), measured in microns. The only requirement on the oxide area of transistors N1, N2 is that each is at least 1.0 square micron with dimensions of at least 1.0 micron×1.0 micron. This condition is to allow the Vt of transistors N1, N2 to be independent of the variations in the W/L ratio. In one example, the W/L ratio of each transistor N1, N2 may be 50.0/10.0 microns. Because the oxide area of transistors N1, N2 are equal, the voltage across transistor N1 is equal to the voltage across transistor N2 and, thus, first voltage V1 is substantially equal to one-half of supply voltage VDD. Consequently, first voltage V1 has a linear relationship to VDD.

Second device stack 18 may include a stack of two dissimilar nFETs N3, N4 electrically connected in series between VDD and ground and biased in a current tunneling mode in order to form a second voltage divider circuit. Intermediate voltage node V2 is located between transistors N3 and N4. The bulk nodes B of corresponding respective transistors N3, N4 may be electrically connected ground. In one embodiment, transistors N3, N4 have substantially equal oxide thicknesses, but have unequal oxide areas and unequal Vts. Like transistors N1, N2 of first device stack 16, the oxide thickness range for transistors N3, N4 may be, e.g., about 4.0 nm down to about 0.8 nm. In one example, the oxide thickness of each transistor N3, N4 is 1.4 nm.

In the present example and like transistors N1, N2, transistor N3 may be considered a normal-Vt device. However, transistor N4 may be considered a low-Vt or an ultra-low-Vt device as compared with each of transistors N1, N2, N3. A low-Vt range may be considered to be about 0.0 mV to about 200 mV. In one example, the low-Vt of transistor N4 may be 0.128 V. An ultra-low-Vt range may be considered to be about −200 mV to about 100 mV. In one example, the ultra-low-Vt of transistor N4 may be 0.026 V. Alternatively, transistor N4 may be considered a high-Vt device as compared with transistor N3. A high-Vt range may be about 300 mV to about 600 mV. In one example, the high-Vt of transistor N4 may be 0.573 V. Because transistors N1, N2, N3, N4 have Vts only a fraction of 1.0V, when power supply voltage VDD is 1.0 volt or less, there is sufficient voltage margin within TD voltage reference circuit 14 to allow device operation.

Like transistors N1, N2, the only requirement on the oxide areas of transistors N3, N4 is that each is at least 1.0 square micron with dimensions of at least 1.0×1.0 micron. In one example, the W/L of transistor N3 may be 130.0/10.0 microns and the W/L ratio of transistor N4 may be 200.0/2.0 microns. Because the Vt of transistors N3, N4 are unequal, the gate tunneling current characteristics of transistors N3, N4 are different and, thus, the voltage across transistor N3 is not equal to the voltage across transistor N4. Consequently, second voltage V2 has a nonlinear relationship to supply voltage VDD and, thus, second voltage V2 is not simply equal to one-half of supply voltage VDD.

Op-amp circuit 20 may be a differential operational amplifier circuit for sensing a difference between two voltages and outputting a signal as a function of this difference. Op-amp circuit 20 may include a standard, high gain, operational amplifier OP-AMP whose negative input is fed by first voltage V1 of first device stack 16 via isolation resistor R1 and whose positive input is fed by second voltage V2 of second device stack 18 via isolation resistor R2. Op-amp circuit 20 may also include an output circuit 30 that includes the output of OP-AMP and feeds an n-type/p-type pair of transistors N5, P1 whose intermediate node is electrically connected to an inverter/buffer (INV), whose output, in turn, is a digital trigger signal TRIGGER FLAG. Transistor P1, which may be controlled by an output of current-mirror circuit 22, provides a constant current source for transistor P1. The output of operational amplifier OP-AMP is a voltage level that is equal to second voltage V2 minus first voltage V1 and, thus, transistor N5, which is controlled by the operational amplifier, turns on when the second voltage V2 is greater than the first voltage V1. Inverter/buffer INV serves to translate the voltage on the node intermediate to transistors N5, P1 to a clean digital signal, i.e., trigger signal TRIGGER FLAG, that may feed standard analog, digital, or mix-signal circuitry (not shown). More specifically, during the power up sequence, trigger signal TRIGGER FLAG is initially a logic zero and as supply voltage VDD ramps up, trigger signal TRIGGER FLAG transitions from a zero to a one at the instant that second voltage V2 is substantially equal to or greater than first voltage V1.

Current-mirror circuit 22 may include a current source 28 that feeds, e.g., an n-type/p-type pair of transistors N6, P2. The output of transistor P2 is a regulated voltage level that may be used to regulate the current through a similar pFET device, such as transistor P1. Similarly, the output of current source 28 is a regulated level that may be used to regulate the current through nFET devices, such as transistor N6. Additionally, current source 28 may provide a current mirror reference supply for operational amplifier OP-AMP.

The trigger point for op-amp circuit 20 issuing trigger signal TRIGGER FLAG may vary as a function of the N3/N4 device ratio, i.e., the ratio of the respective oxide areas of transistors N3, N4. Therefore, with the oxide area of transistor N3 held constant, the trigger point for trigger signal TRIGGER FLAG may be varied by adjusting the oxide area of transistor N4, thereby, changing the N3/N4 device ratio. For example, for a trigger point where supply voltage VDD is 1 volt, the N3/N4 device ratio is set such that the crossover point of the profiles of first and second voltages V1, V2 is the desired trigger point voltage divided by two, which in this example is 1 volt divided by two, i.e., 0.5 volts. Example N3/N4 device ratios and resulting crossover points of the profiles of first and second voltages V1, V2 are described below in connection with FIG. 3, and one example trigger point is described below relative to FIG. 5.

FIG. 3 illustrates an exemplary intermediate node vs. power supply voltage plot 30, which illustrates various N3/N4 device ratios and resulting crossover points on the profiles of first and second voltages of TD voltage detection circuit 14 of FIG. 2. In particular and referring again to FIG. 2, when supply voltage VDD is ramping up, intermediate node vs. reference node voltage plot 30 shows multiple examples of how there is only one nonzero point at which first voltage V1, which has a linear relationship to supply voltage VDD, and second voltage V2, which has a nonlinear relationship to supply voltage VDD, are equal. This crossover point is a function of the N3/N4 device ratio of second device stack 18. The x-axis of intermediate node vs. reference node voltage plot 30 indicates supply voltage VDD voltage and the y-axis indicates first and second voltages V1, V2.

Intermediate node vs. reference node voltage plot 30 shows a plot of a V1 voltage ramp 32, which in every scenario is substantially equal to one-half of supply voltage VDD because it has a linear relationship to supply voltage VDD and transistors N1, N2 in this example have identical voltages drops. In a first example, intermediate node vs. reference node voltage plot 30 shows a plot of a first V2 voltage ramp 34 that intersects with V1 voltage ramp 32 at a point A, at which first and second voltages V1, V2 each equal 200 mV, which is the result of an N3/N4 device ratio of 11.92. More details of the circuit conditions that generate first V2 voltage ramp 34 are shown in Example No. 1 of Table 1 below.

In a second example, intermediate node vs. reference node voltage plot 30 shows a plot of a second V2 voltage ramp 36 that intersects with V1 voltage ramp 32 at a point B only, at which first and second voltages V1, V2 each equal 300 mV, which is the result of an N3/N4 device ratio of 7.09. More details of the circuit conditions that generate second V2 voltage ramp 36 are shown in Example No. 2 of Table 1 below.

In a third example, intermediate node vs. reference node voltage plot 30 shows a plot of a third V2 voltage ramp 38 that intersects with V1 voltage ramp 32 at a point C only, at which first and second voltages V1, V2 each equal 400 mV, which is the result of an N3/N4 device ratio of 3.64. More details of the circuit conditions that generate third V2 voltage ramp 38 are shown in Example No. 3 of Table 1 below.

In a fourth example, intermediate node vs. reference node voltage plot 30 shows a plot of a fourth V2 voltage ramp 40 that intersects with V1 voltage ramp 32 at a point D only, at which first and second voltages V1, V2 each equal 500 mV, which is the result of an N3/N4 device ratio of 2.52. More details of the circuit conditions that generate fourth V2 voltage ramp 40 are shown in Example No. 4 of Table 1 below.

In a fifth example, intermediate node vs. reference node voltage plot 30 shows a plot of a fifth V2 voltage ramp 42 that intersects with V1 voltage ramp 32 at a point E only, at which first and second voltages V1, V2 each equal 600 mV, which is the result of an N3/N4 device ratio of 2.09. More details of the circuit conditions that generate fifth V2 voltage ramp 42 are shown in Example No. 5 of Table 1 below.

In a sixth example, intermediate node vs. reference node voltage plot 30 shows a plot of a sixth V2 voltage ramp 44 that intersects with V1 voltage ramp 32 at a point F only, at which first and second voltages V1, V2 each equal 700 mV, which is the result of an N3/N4 device ratio of 1.85. More details of the circuit conditions that generate sixth V2 voltage ramp 44 are shown in Example No. 6 of Table 1 below.

TABLE 1

Example circuit conditions and resulting voltages V1 and V2

| Example No. | VDD voltage (mV) | Oxide thickness (nm) | N1&N2 W/L (microns) | N3 W/L (microns) | N4 W/L (microns) | N3/N4 device ratio | V1 = V2 voltage (mV) |
|---|---|---|---|---|---|---|---|
| 1 | 400 | 1.40 | 5.0/10.0 | 130/10 | 10.9/10 | 11.92 | 200 |
| 2 | 600 | 1.40 | 5.0/10.0 | 130/10 | 18.33/10 | 7.09 | 300 |
| 3 | 800 | 1.40 | 5.0/10.0 | 130/10 | 35.71/10 | 3.64 | 400 |
| 4 | 1000 | 1.40 | 5.0/10.0 | 130/10 | 51.58/10 | 2.52 | 500 |
| 5 | 1200 | 1.40 | 5.0/10.0 | 130/10 | 62.2/10 | 2.09 | 600 |
| 6 | 1400 | 1.40 | 5.0/10.0 | 130/10 | 70.27/10 | 1.85 | 700 |

Note:
In all examples, N1, N2, & N3 are normal-Vt devices and N4 is low-Vt device.

Intermediate node vs. reference node voltage plot 30 of FIG. 3 and Table 1 illustrate how modifying, for example, the N3/N4 device ratio of second device stack 18 allows the point at which first voltage V1 equals second voltage V2 (i.e., the crossover point) to change. In doing so, the trigger point for trigger signal TRIGGER FLAG of TD voltage detection circuit 14 may be adjusted for a given application.

It is demonstrated in Table 1 that as N3/N4 device ratio is decreased, the intermediate second voltage V2 becomes larger. This can be explained by the difference in tunneling current of a normal-Vt device versus that of a low-Vt device at a given gate voltage. A gate current vs. gate voltage plot 45 of FIG. 4 shows gate tunneling current as a function of gate voltage for high-Vt (i.e., high-Vt nFET plot 46), normal-Vt (i.e., normal-Vt nFET plot 47), low-Vt (i.e., low-Vt nFET plot 48), and very low-Vt (i.e., very low-Vt nFET plot 49) devices. For a given gate voltage, the current per square micrometer of gate-oxide area increases as the Vt of the device decreases. It can also be seen that as gate voltage is increased, this difference between the low-Vt device current and the normal-Vt device current reduces.

The voltage detection circuit of FIGS. 1 and 2 outputs a flag at a VDD voltage which is essentially 2× the voltage where first voltage V1 equals second voltage V2, and because first voltage V1 is essentially one-half of voltage VDD, and the current through device N3 equals the current through device N4, it follows that the voltage across device N3 must equal the voltage across device N4, which equals second voltage V2. Hence the gate to source/drain voltages on devices N3, N4 are equal so their relative current densities can be found by inspection of the normal-Vt curve, and the low-Vt curve found respectively in FIG. 4. The current density of the low-Vt device (N4), is higher than that of the normal-Vt device (N3), so it follows that device N4 requires a smaller relative device area for equal tunneling current at equal gate to source/drain voltages. At higher gate voltages, the difference between the low-Vt device current and the normal-Vt device current is reduced so the area of low-Vt device N4 must be increased over its value at lower gate voltages. The device ratio of N3/N4 can be adjusted higher or lower from the current density curves of FIG. 4 to chose a trigger voltage at a desired VDD.

Referring again to FIG. 2, example W/L ratios of the transistors of TD voltage detection circuit 14 that support the W/L values of N1, N2, N3, and N4 shown in Table 1 are as follows: P1=3.0/1.0, P2=3.0/1.0, N5=1.0/1.0, and N6=1.0/1.0.

FIG. 5 illustrates an exemplary trigger voltage plot 50 illustrating the performance of TD voltage detection circuit 14 of FIGS. 1 and 2. In particular, trigger voltage plot 50 of FIG. 5 shows first and second voltages V1, V2 ramping up with the power supply voltage (e.g., voltage VDD) and generating a trigger voltage. More specifically, trigger voltage plot 50 shows a power supply signal 52 that is ramping from 0 to 2.0 volts, a V1 signal 54 that is ramping linearly from 0 to 1.0 volts at a rate of about power supply signal 52 divided by two, a set of V2 signals 56 (i.e., best case, nominal, and worst case signals) that are ramping nonlinearly from 0 volts to respective crossover points A (best case), B (nominal), and C (worst case) at which first voltage V1 equals second voltage V2, and a set of trigger signals 58 (i.e., best case, nominal, and worst case signals) that transition from a logic zero to a logic one at points D (best case), E (nominal), and F (worst case) along power supply signal 52 that correlate to points A, B, and C, respectively. In this example, the desired power supply trigger point is where power supply signal 52 equals 1 volt, the W/L of N3 is 130/10, and the W/L of N4 is 51.58/10, the resulting N3/N4 device ratio is (130×10)/(51.58×10)=2.52, such that the crossover point of first and second voltages V1, V2 is approximately the desired power supply trigger point divided by two, or 0.5 volts, which results in power supply signal 52 voltage values of point D=0.996 v, E=1.070 v, and F=1.131 v. In this example, the predictability of the transition of trigger signals 58 falls in a narrow range of about 135 mV of power supply signal 52.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit chip, comprising:
   a power supply network for supplying a supply voltage to functional circuitry; and
   a trigger circuit that includes:
      a first direct current (DC) voltage divider stack comprising:
         a first input in electrical communication with said power supply network; and
         a first internal node for providing a first divided output voltage;
         wherein said first DC voltage divider stack is configured so that the first divided output voltage has a linear relationship to the supply voltage;

a second DC voltage divider stack electrically coupled to said power supply network in parallel with said first DC voltage divider stack, said second DC voltage divider stack comprising:
  a second input in electrical communication with said power supply network; and
  a second internal node for providing a second divided output voltage;
  wherein said second DC voltage divider stack is configured so that the second divided output voltage has a nonlinear relationship to the supply voltage; and
output circuitry in electrical communication with said first internal node and said second internal node and operatively configured to generate a digital trigger flag as a function of said first divided output voltage and said second divided output voltage;
wherein said second DC voltage divider stack comprises a first current-tunneling device and a second current-tunneling device coupled in series with one another so as to define said second internal node, said trigger circuit being configured so that said output circuitry generates the digital trigger flag as a function of tunneling current in each of said first and second current-tunneling devices.

2. An integrated circuit chip according to claim 1, wherein said first current-tunneling device is a low-voltage-threshold device and said second current-tunneling device is a regular-voltage-threshold device.

3. An integrated circuit chip according to claim 1, wherein said first current-tunneling device is a transistor having a first gate oxide that has a first predetermined area and said second current-tunneling device is a transistor having a second gate oxide that has a second predetermined area that is intentionally different from said first predetermined area.

4. An integrated circuit chip according to claim 1, wherein said first DC voltage divider stack comprises a third current-tunneling device and a fourth current-tunneling device coupled in series with one another so as to define said first internal node, said trigger circuit being configured so that said output circuitry generates the digital trigger flag further as a function of tunneling current in each of said third and fourth current-tunneling devices.

5. An integrated circuit chip according to claim 1, wherein said output circuitry comprises a differential amplifier and an output stage device responsive to an output stage control voltage, said differential amplifier for receiving and operating on said first divided output and said second divided output so as to output said output stage control voltage.

6. An integrated circuit chip according to claim 1, wherein said output circuitry is operatively configured to initiate output of the digital trigger flag when said second divided output voltage is substantially equal to said first divided output voltage.

7. An integrated circuit, comprising:
  a power supply network for supplying a supply voltage to functional circuitry; and
  a trigger circuit that includes:
    a first direct current (DC) voltage divider stack comprising:
      a first input in electrical communication with said power supply network; and
      a first internal node for providing a first divided output voltage;
      wherein said first DC voltage divider stack is configured so that the first divided output voltage has a linear relationship to the supply voltage;
    a second DC voltage divider stack electrically coupled to said power supply network in parallel with said first DC voltage divider stack and comprising:
      a first current-tunneling device that includes a second input in electrical communication with said power supply network, wherein said first current-tunneling device is a low-voltage-threshold device; and
      a second current-tunneling device electrically connected in series with said first current-tunneling device so as to define a second internal node for providing a second divided output voltage, wherein said second current-tunneling device is a regular-voltage-threshold device;
      wherein the second divided output voltage is generated as a function of substantially only tunneling current through said first and second current-tunneling devices; and
    output circuitry in electrical communication with said first internal node and said second internal node and operatively configured to generate a digital trigger flag as a function of said first divided output voltage and said second divided output voltage.

8. An integrated circuit according to claim 7, wherein said first current-tunneling device is a transistor having a first gate oxide that has a first predetermined area and said second current-tunneling device is a transistor having a second gate oxide that has a second predetermined area that is intentionally different from said first predetermined area.

9. An integrated circuit according to claim 7, wherein said first DC voltage divider stack comprises a third current-tunneling device and a fourth current-tunneling device coupled in series with one another so as to define said first internal node, said trigger circuit being configured so that said output circuitry generates the digital trigger flag further as a function of tunneling current in each of said third and fourth current-tunneling devices.

10. An integrated circuit according to claim 7, wherein said output circuitry comprises a differential amplifier and an output stage device responsive to an output stage control voltage, said differential amplifier for receiving and operating on said first divided output and said second divided output so as to output said output stage control voltage.

11. An integrated circuit according to claim 7, wherein said output circuitry is operatively configured to initiate output of the digital trigger flag when said second divided output voltage is substantially equal to said first divided output voltage.

12. An integrated circuit, comprising:
  a power network for providing a supply voltage; and
  a voltage detection circuit for providing a digital trigger flag, said voltage detection circuit comprising:
    a first DC tunneling-device stack having a first intermediate output node and configured so as to output a first output voltage that is a linear function of the supply voltage;
    a second DC tunneling-device stack having a second intermediate output node and configured so as to output a second output voltage that is a non-linear function of the supply voltage; and
    an operational amplifier circuit operatively configured to generate the digital trigger flag by comparing the first and second output voltages with one another;
  wherein, during operation, said voltage detection circuit generates the digital trigger flag in response to substantially only tunneling current through each of said first and second DC tunneling-device stacks.

13. An integrated circuit according to claim 12, wherein said first DC tunneling-device stack includes a first pair of series-connected current-tunneling devices and said second DC tunneling-device stack includes a second pair of series-connected current-tunneling devices.

14. An integrated circuit according to claim 13, wherein said first pair of series-connected current-tunneling devices includes a first pair of capacitor-connected transistors and said second pair of series-connected current-tunneling devices includes a second pair of capacitor-connected transistors.

15. An integrated circuit according to claim 14, wherein said first pair of capacitor-connected transistors are configured to provide substantially the same tunneling current as one another when subjected to a particular voltage.

16. An integrated circuit according to claim 15, wherein said second pair of capacitor-connected transistors are configured to provide substantially different tunneling currents relative to one another when subjected to the particular voltage.

17. An integrated circuit according to claim 12, wherein said trigger circuit includes:
  a pair of series-connected transistors of opposite electrical types each having a gate;
  an operational amplifier that includes:
    an output electrically connected to said gate of one of said pair of series-connected transistors; and
    a pair of inputs electrically connected to corresponding respective ones of said first and second intermediate output nodes; and
  a current mirror electrically connected to said gate of the other of said pair of series-connected transistors.

18. An integrated circuit according to claim 17, further comprising an inverter having an input electrically connected between ones of said pair of series-connected transistors.

* * * * *